(12) United States Patent
Pezeshki et al.

(10) Patent No.: US 8,971,376 B2
(45) Date of Patent: Mar. 3, 2015

(54) BROAD AREA LASER PUMP COMBINER

(75) Inventors: Bardia Pezeshki, Menlo Park, CA (US); John Heanue, Boston, MA (US)

(73) Assignee: Kaiam Corp., Newark, CA (US)

( * ) Notice: Subject to any disclaimer, the term of this patent is extended or adjusted under 35 U.S.C. 154(b) by 0 days.

(21) Appl. No.: 13/205,405

(22) Filed: Aug. 8, 2011

(65) Prior Publication Data

US 2012/0057607 A1    Mar. 8, 2012

Related U.S. Application Data

(60) Provisional application No. 61/371,616, filed on Aug. 6, 2010.

(51) Int. Cl.
| | |
|---|---|
| *H01S 3/08* | (2006.01) |
| *H01S 5/022* | (2006.01) |
| *G02B 6/30* | (2006.01) |
| *G02B 6/42* | (2006.01) |
| *H01S 5/00* | (2006.01) |
| *H01S 5/20* | (2006.01) |
| *H01S 3/094* | (2006.01) |
| *H01S 5/40* | (2006.01) |

(52) U.S. Cl.
CPC .............. *H01S 5/02284* (2013.01); *G02B 6/30* (2013.01); *G02B 6/305* (2013.01); *G02B 6/4206* (2013.01); *H01S 5/005* (2013.01); *H01S 5/2036* (2013.01); *H01S 3/094007* (2013.01); *H01S 3/094049* (2013.01); *H01S 5/4031* (2013.01)
USPC ......... 372/108; 372/50.12; 372/101; 372/107

(58) Field of Classification Search
USPC ................................ 372/50.12, 101, 107, 108
See application file for complete search history.

(56) References Cited

U.S. PATENT DOCUMENTS

| | | | |
|---|---|---|---|
| 6,445,858 B1* | 9/2002 | Musk ............................ | 385/52 |
| 7,193,771 B1* | 3/2007 | Smith et al. ................... | 359/333 |
| 2003/0039275 A1* | 2/2003 | Pezeshki ........................ | 372/20 |
| 2003/0223686 A1* | 12/2003 | Ota et al. ....................... | 385/33 |
| 2004/0105644 A1* | 6/2004 | Dawes ........................... | 385/129 |
| 2004/0234202 A1* | 11/2004 | Sato et al. ...................... | 385/39 |
| 2005/0036526 A1* | 2/2005 | Doerr et al. .................... | 372/20 |
| 2007/0223552 A1* | 9/2007 | Muendel et al. ............. | 372/50.12 |
| 2008/0019010 A1* | 1/2008 | Govorkov et al. ............. | 359/641 |
| 2008/0101429 A1* | 5/2008 | Sipes ........................ | 372/50.12 |

* cited by examiner

*Primary Examiner* — Yuanda Zhang
(74) *Attorney, Agent, or Firm* — Klein, O'Neill & Singh, LLP

(57) ABSTRACT

Multiple broad area lasers are coupled to a planar lightwave circuit, where the waveguides come together to form a single wide emitting aperture. A tapered lens is used at the output of the planar lightwave circuit to transform the highly asymmetric mode into a conventional round mode. This configuration allows much higher "brightness", allowing 10 or more 100 um wide broad area lasers to be coupled into a single 100 um core multimode fiber. This is considerably more efficient than the standard method of combining a single 100 um wide broad area laser to a 100 um core multimode fiber.

8 Claims, 12 Drawing Sheets

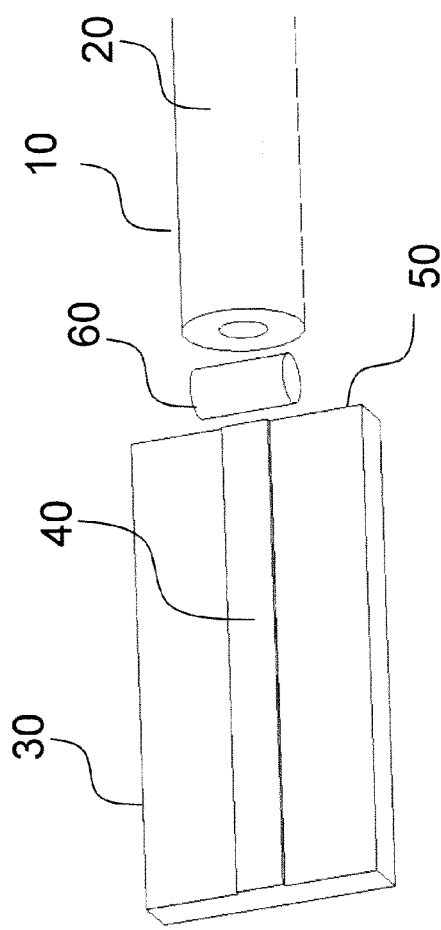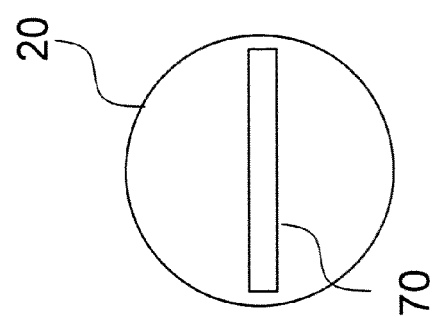
Fig. 1a
Fig. 1b
Fig 1: Prior art

Fig 2: Prior art

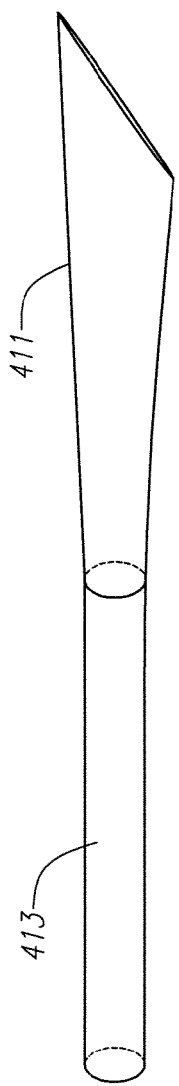
Fig. 4a
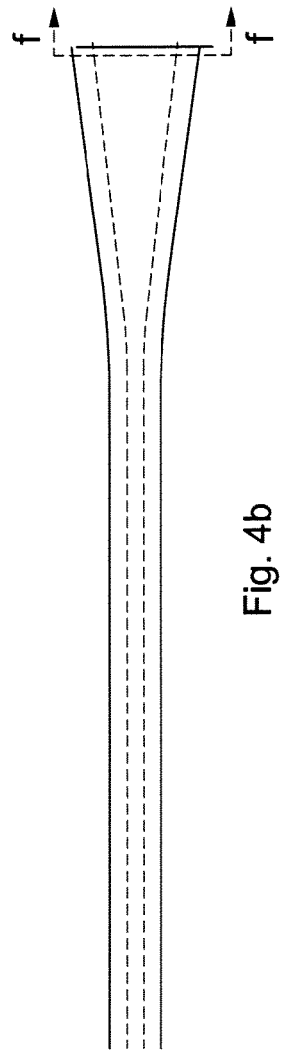
Fig. 4b
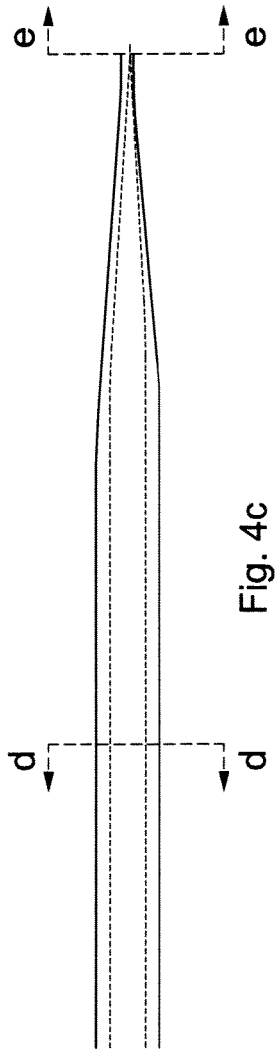
Fig. 4c
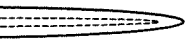
Fig. 4f
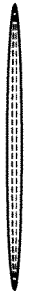
Fig. 4e
Fig. 4d

(12) United States Patent
US 8,971,376 B2

BROAD AREA LASER PUMP COMBINER

CROSS REFERENCE TO RELATED APPLICATIONS

This application claims the benefit of the filing date of U.S. Provisional Patent Application No. 61/371,616, filed Aug. 6, 2010, the disclosure of which is incorporated by reference.

BACKGROUND OF THE INVENTION

Single mode semiconductor lasers with emitting apertures on the order of 2 um×2 um are generally limited to roughly a watt of output power. Higher power lasers can be realized by increasing the output aperture much wider to a 100 um or so. The laser becomes multimode in the wide lateral direction, but stays single mode in the vertical direction. Such lasers can provide on the order of 5 to 10 Watts of optical power reliability and are used in various applications such as materials processing and industrial processes.

In addition to the total power output, another key performance metric of these lasers is the "brightness", which is inversely proportional to the product of the emitting area and the numeric aperture—the brighter the source, the smaller the aperture or the smaller the divergence of the beam. A brighter source is generally preferred as it can be focused tighter to provide higher energy density.

A recent commercially interesting application of these broad area lasers is for pumping double clad fiber lasers. Generally multiple broad area lasers are individually coupled to multimode fibers. These fibers are in turn combined into even larger core diameter multimode fibers, which subsequently pump the double clad fiber. Hundreds of watts of pump power can be obtained in this manner. However, since "brightness" must be preserved, the more power one desires, the larger the core diameter or the NA of the final merged fiber. For example, if one desires 90 Watts of pump power using nine elements of low individual sources that are coupled to 100 um core diameter fibers, the final fiber in the assembly should have an area that is 9 times as much or a diameter of 300 um microns. As the diameter of the final combined fiber increases, the overlap with the single mode core of the double clad fiber decreases. This large core size in turn lowers efficiency and makes the fiber harder to manufacture and handle. Thus it is usually desirable to use the brightest sources possible in the first place.

Considerable brightness is wasted in the first step of the process, where a 100 micron broad area laser with a vertical aperture of 2-3 um is coupled to a 100 micron diameter round fiber. Though the laser fills the fiber laterally, vertically a lot of the fiber area is wasted. In theory multiple lasers of such kind can be coupled to a single multimode core if appropriate packaging can be realized.

BRIEF SUMMARY OF THE INVENTION

Aspects of the present invention relate to broad area lasers. In one aspect the invention provides A broad area laser device, comprising: a plurality of broad area lasers; a planar lightwave circuit (PLC) to receive light from the lasers; and a flattened tapered fiber to receive light from the PLC.

In another aspect the invention provides A broad area laser device, comprising: a plurality of broad area laser assemblies, each including a broad area laser, a first lens to collimate light of the broad area laser in a first axis, and a second lens to collimate light of the broad area laser in a second axis; a coupling lens to couple light of the broad area lasers into an output; and a mirror structure to direct light of the broad area lasers to the coupling lens.

These and other aspects of the invention are more fully comprehended upon review of this disclosure.

BRIEF DESCRIPTION OF THE DRAWINGS

Aspects of the present patent are illustrated by way of examples.

FIG. 1a (prior art) illustrates a broad area laser optically coupled to a multimode fiber.

FIG. 1b (prior art) illustrates illumination area of a fiber illuminated by a broad area laser.

FIG. 3a illustrates a configuration in which light from multiple broad area emitters is coupled into a multimode fiber using a Planar Lightwave Circuit (PLC) and a flattened tapered fiber.

FIG. 3b illustrates a portion of the PLC of FIG. 3a.

FIG. 4a illustrates a view of a flattened tapered fiber useful in aspects of the invention.

FIG. 4b illustrates a top view of the fiber of FIG. 4a.

FIG. 4c illustrates a side view of the fiber of FIG. 4a.

FIG. 4d illustrates a sectional view of the fiber of FIG. 4c.

FIG. 4e illustrates a further sectional view of the fiber of FIG. 4c.

FIG. 4f illustrates a sectional view of the fiber of FIG. 4b.

DETAILED DESCRIPTION

Figure 2A:
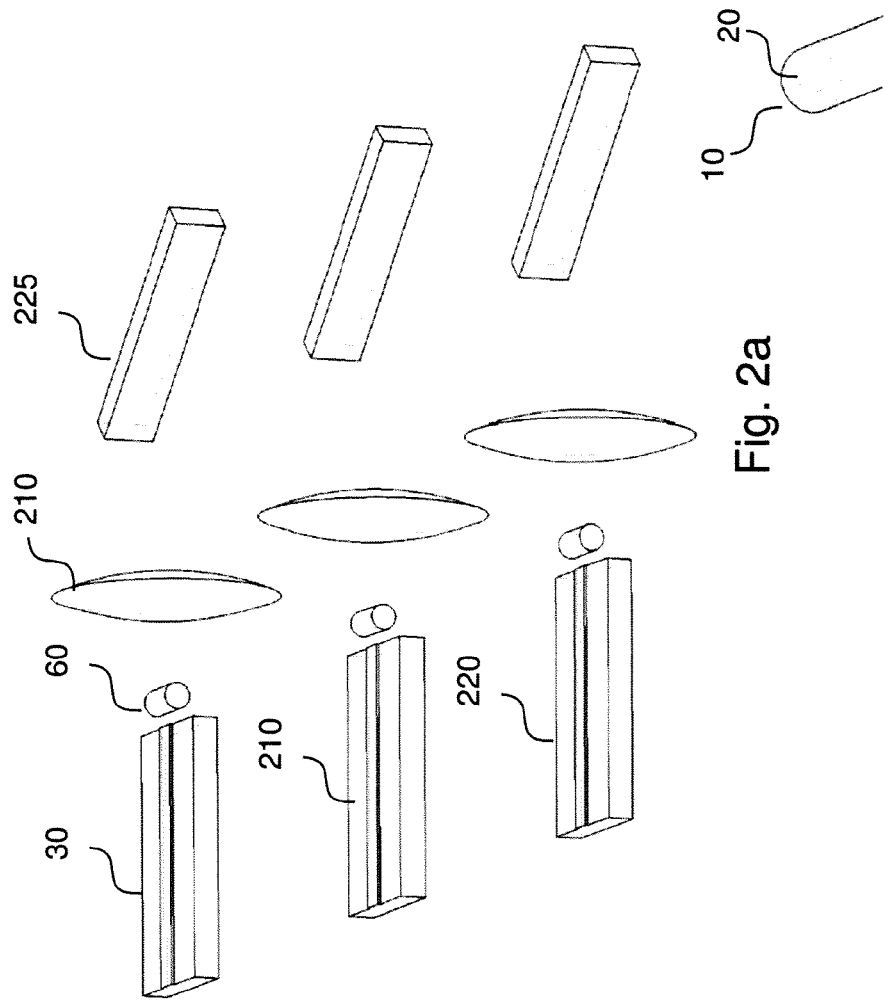
FIG. 2a (prior art) illustrates a configuration where three lasers are coupled to a multimode fiber simultaneously.

FIG. 1a shows a simple way that currently broad area lasers are coupled to a multimode fiber. In the drawing, a 250 micron diameter fiber 10 has a hundred micron diameter core 20. A broad area laser 30 has an active stripe 40 with a width of one hundred microns that emits light from a front facet 50. In the configuration shown in FIG. 1a, a cylindrical lens 60 reduces the divergence in the vertical direction to match the NA of the fiber, while the light is not collimated in the lateral direction. The lens 60 is optional, as the laser can be positioned directly against the fiber, in a manner known as butt coupling, such that the emitting aperture is aligned to the center of the fiber core. However, the lens 60 does improve the coupling efficiency. In both cases, the laser illuminates the central part of the core, as shown in FIG. 1b. The rectangle 70 is the area illuminated by the broad area laser. This area quickly spreads out in the fiber and the modes move and mix so after a given length of fiber the entire core is illuminated, but at a reduced brightness, since the concentrated initial area 70 is dispersed throughout the core. As explained previously, this reduces the utility of the light.

Figure 2B:
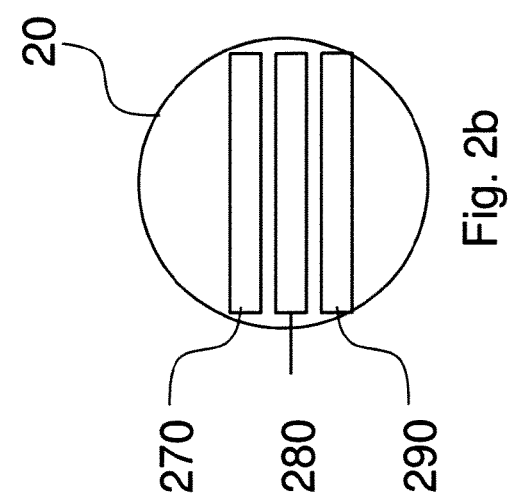
FIG. 2b (prior art) illustrates illumination of a fiber by three lasers.

Though not commercially available, there are ways to couple multiple broad area lasers to the same fiber core simultaneously. FIG. 2 shows a possible configuration where three lasers 30, 210, 220 are all coupled to a multimode fiber simultaneously. In this case a small cylindrical lens 60 collimates the fast axis of the laser, then a second lens 210 forms an image on the fiber face after reflecting from a mirror 225. The optics of the three lasers are identical, except that the images are offset in the vertical direction by a few microns, such that all three images fit on the fiber core, as shown in FIG. 2b. In this case the image of the light from laser 30 forms the rectangle 270, that of laser 210 forms the rectangle 280, and that of 220 forms the rectangle 290. To prevent blocking of the images, ideally the lasers themselves are vertically offset and the mirrors are made narrow in the vertical direction, such that the light from the back lasers can pass above or below the mirror. Alternatively, the mirrors can be offset linearly such that the light from the rear lasers passes to the right or left of the mirror. That causes a change in the incidence angle onto the fiber, but the effect on coupling efficiency is minimal. The advantage of the structure shown in FIG. 2 is that the light exiting the fiber is considerably brighter, with three times as much power coupled into the same 100 micron diameter core. With proper optics and mode matching it should be possible to couple, for example, up to 10 such broad area lasers efficiently into the fiber.

FIG. 3a shows a simpler way to couple multiple broad area emitters into a multimode fiber. The same lasers, 30, 210, and 220 are used with a cylindrical lens, the first cylindrical lens marked 60 in the figure, to couple light into a planar lightwave circuit (PLC) 300, which are lithographically defined planar waveguides typically fabricated on silicon wafers using germanium doped silicon dioxide. The wafer contains multiple broad area waveguides 310, each single mode in the vertical direction and multimode in the horizontal or planar direction. Three are shown in FIG. 3a. Typical dimensions of the cores of each waveguide would be 100 um wide and 10 microns thick. On the PLC the three waveguides come together to form a very wide single waveguide 320 at the exit of the PLC. Since there is no change in the emitting area, brightness is conserved on the PLC. Then to couple out of the PLC, a flattened fiber 330 is used. If the index difference between the core and the cladding stays the same in the PLC as in the tapered/flattened fiber, then the two can be butt-coupled, or simply placed or epoxied together with no intermediate optics. FIG. 3b shows an exaggerated view of the PLC 300, showing that the output waveguide width 320 is simply n times the width of the input waveguide, where n is the number of input waveguides. The purpose of the PLC is simply to eliminate or reduce the dead space between the modes.

The flattened tapered fiber is better shown in FIG. 4a-f. Such tapers are relatively easy to make in optical fibers and may be realized by stretching or squeezing the fiber while the temperature is elevated to soften the glass. In this particular case pressure is applied to flatten the fiber, thus producing a structure where, for an end 411 of the fiber, the width has increased and the thickness has decreased, as compared to an extending cylindrical portion 413 of the fiber. In the embodiment show in FIGS. 4a-f, relative expansion in the lateral direction and the contraction in the vertical direction for the end of the fiber, compared to the extending cylindrical portion, is a factor of 5. In one example the diameter of cylindrical fiber is 250 μm core, with a 100 μm core, with the core at the end of the fiber being 500 μm in the lateral direction and 20 μm in the vertical direction.

Figure 3:
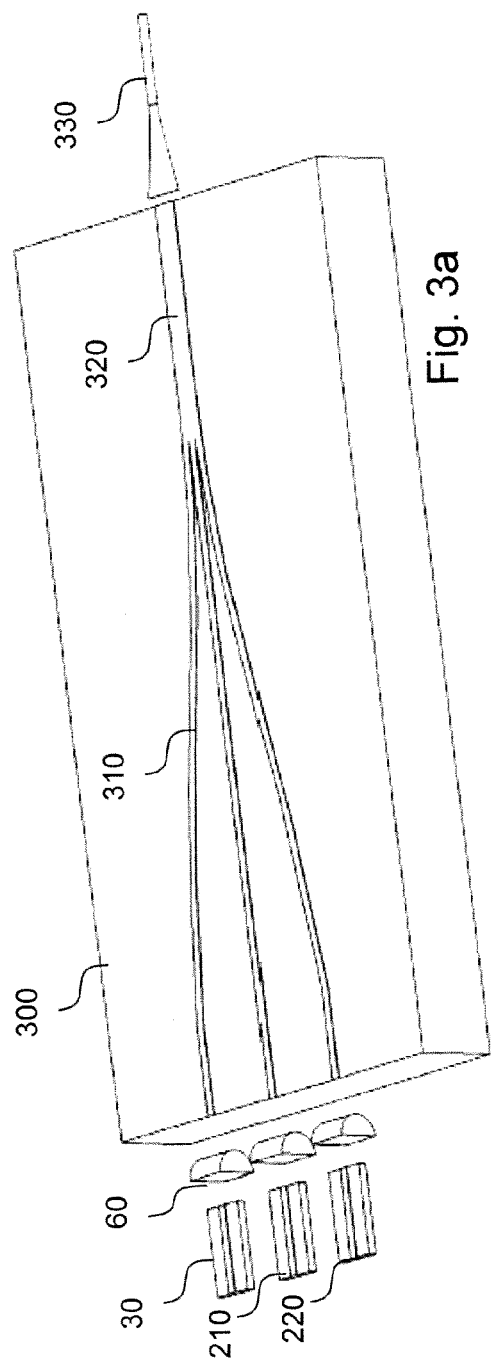
Figure 3:
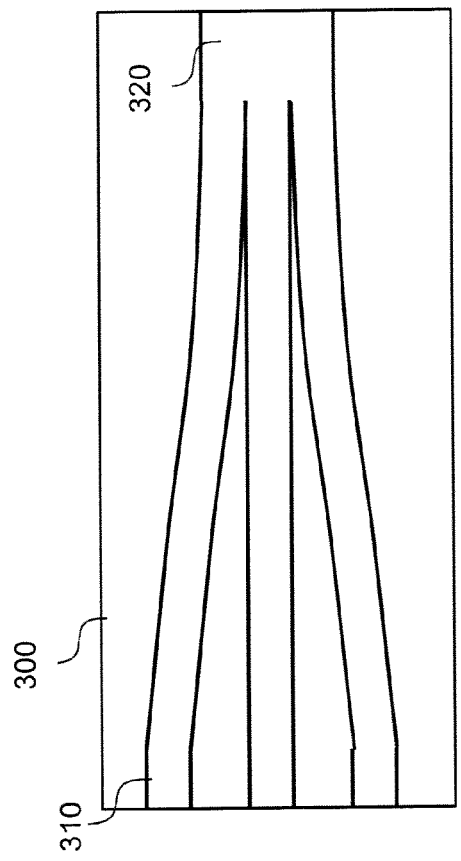
Figure 5A:
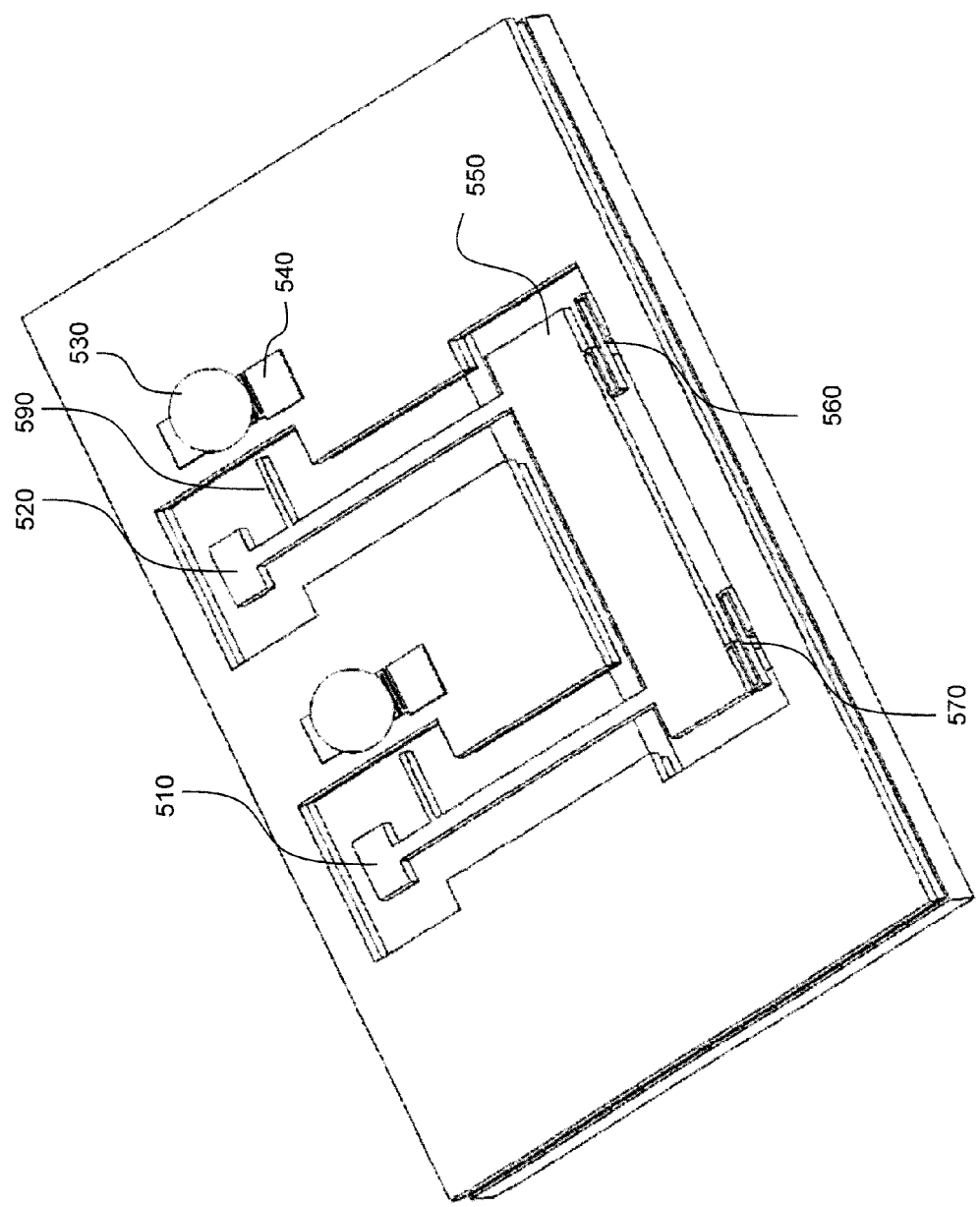
FIGS. 5a and 5b illustrate a MEMs alignment unit in accordance with aspects of the invention.
Figure 5B:
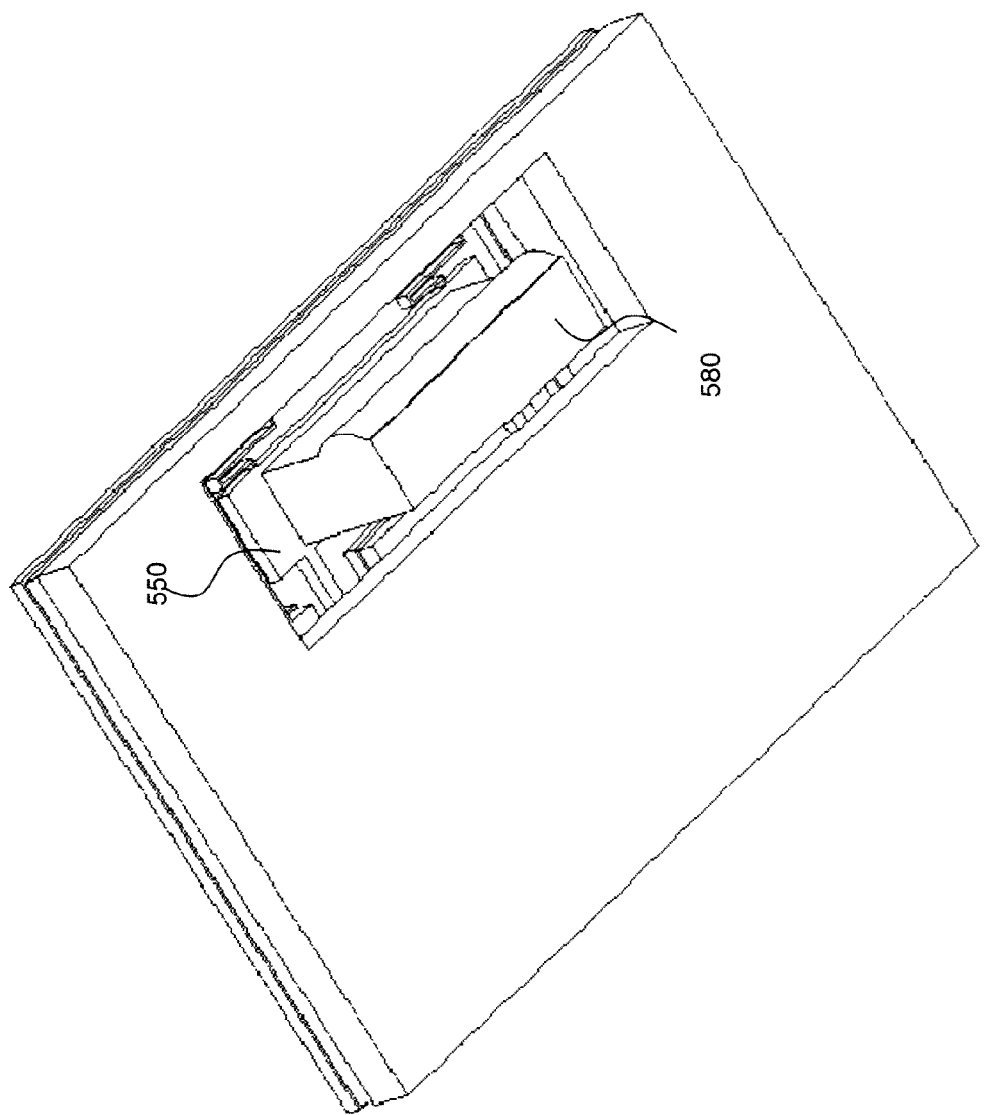

The structure of FIG. 3 is particularly amenable to MEMS based coupling techniques where each cylindrical lens can be aligned in x y and z using micromechanical levers. Such a MEMS alignment unit is shown in FIG. 5a (top side) and 5b (bottom side). It is fabricated on SOI with patterning on both front and backside. The front side includes a platform 550, on the backside of which is mounted a cylindrical lens 580 (shown in FIG. 5b). The platform is attached to two silicon levers with handles on the ends 510, 520. These handles are manipulated simultaneously that in turn move the platform. The platform is connected to the body through two springs 560 and 570, with the springs being on an opposite side of the platform than the levers in the embodiment illustrated in FIGS. 5a and b. The silicon springs can stretch and bend to allow the platform 550 and thus the lens 580 under it to move. If the two handles are pulled or pushed as to stretch the two springs uniformly, the lens moves generally in a corresponding direction, which may be considered in and out. If the two handles are moved to one side or vertically, the lens moves correspondingly. Finally, if one handle is moved down, while the other is moved up, the lens tilts. Once optimal alignment has been achieved, the handles are locked down using solder balls such as 530. Electric current may be passed through heaters 540 such that the heat melts the solder ball 530. In this particular design, the parts are initially placed such that proper alignment will include moving the extension towards the solder. Thus, the solder ball may be melted, and moving the handle to the right (as seen in FIG. 5a), moves an extension 590 on the handle into the molten solder ball 530. At this point, the current is removed, the solder freezes, and the handle is locked into place. The advantage of this technique is that submicron tolerances for moving and locking down the optical part are eased to many microns as motions are amplified by the arm and handle.

Figure 6:
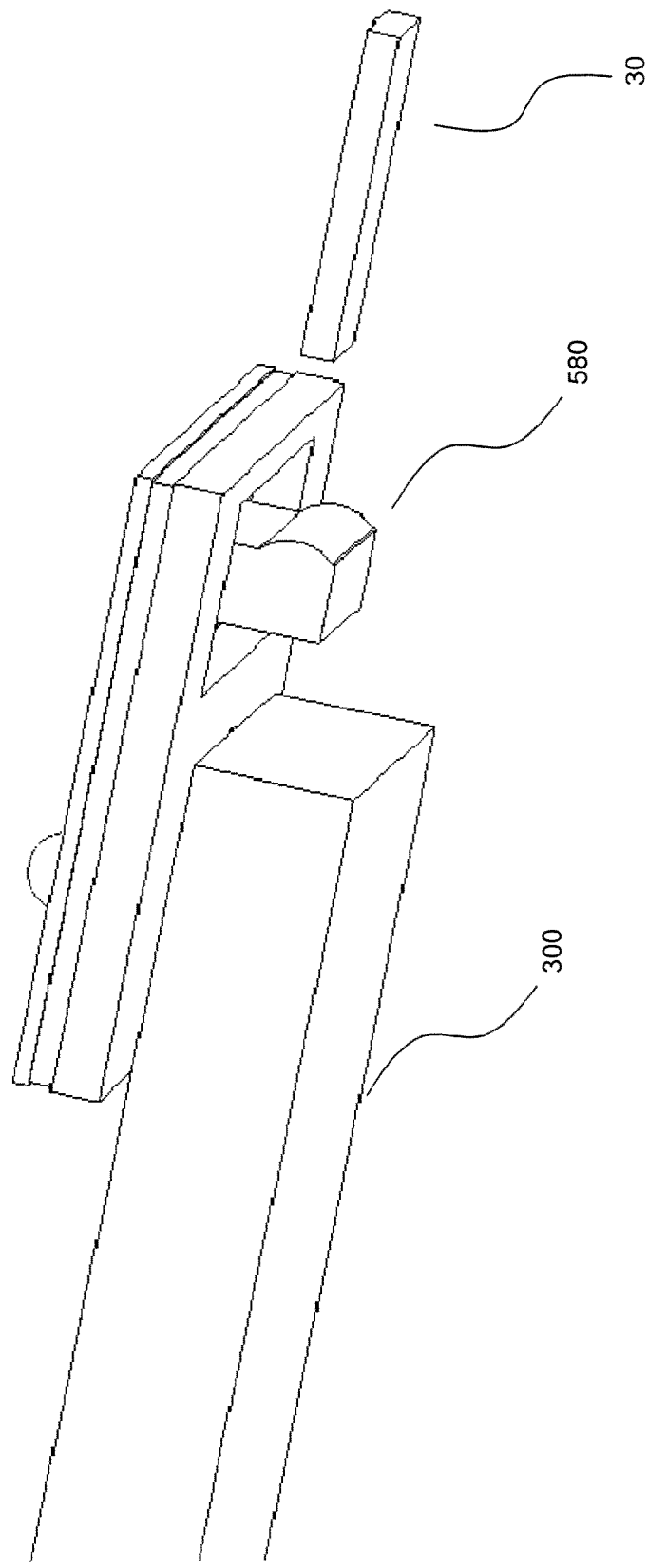
FIG. 6 illustrates an assembly including the MEMs alignment unit of FIGS. 5a and 5b and broad area laser.

The final assembly looks similar to FIG. 6, where the PLC 300 and the broad area laser 30 are shown with respect to the MEMs alignment unit including lens 880. The submount for the laser and the base of the assembly are not shown.

The MEMS alignment assembly can also be used with the mirror configuration shown in FIG. 2. In this case, the lenses are positioned using the MEMs manipulators so that the beams are aligned with mirrors shown or for example fold mirrors or stacked mirrors in FIG. 2. In this embodiment the lens and MEMS chip would not be mounted on or with respect to a PLC, but on a base, and lenses would collimate the beam from the laser, rather than focus the beam onto a PLC. The collimated beam is reflected toward an output fiber. A coupling lens is placed in front of the output fiber to focus the beams into the fiber.

Figure 10:
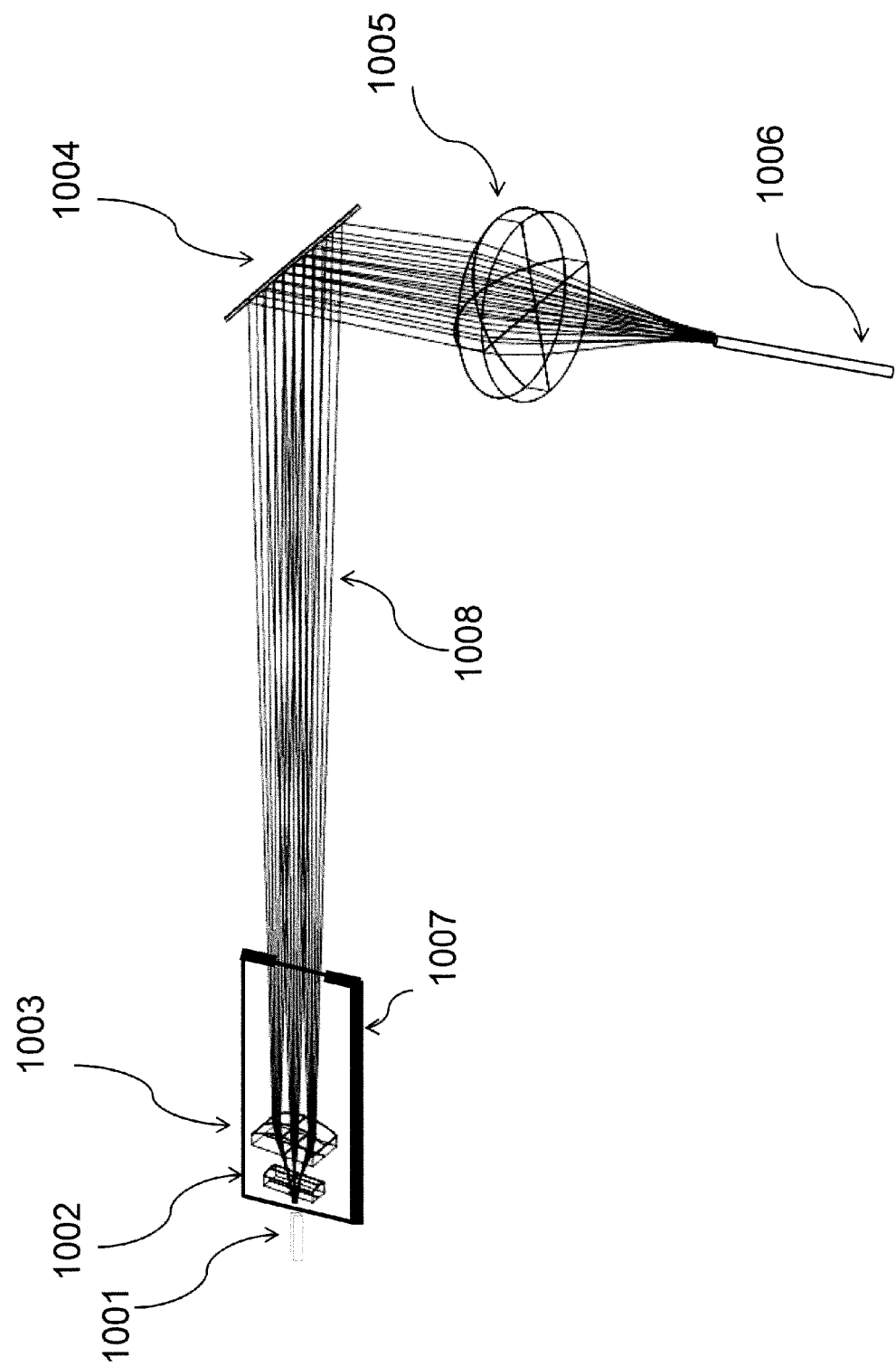
FIG. 10 illustrates a further embodiment in accordance with aspects of the invention.

In one embodiment, as shown in FIG. 10, light from a laser 1001 is collimated by a fast axis collimating lens 1002 and a slow axis collimating lens 1003, with the light shown as optical rays 1008. The collimated light is directed by a mirror 1004 to a coupling lens 1005. The coupling lens focuses the light into an output fiber 1006.

The collimating lenses are on a MEMs alignment chip 1007, as illustrated in FIG. 10. The MEMs alignment chip may be as previously discussed, for example with both collimating lenses on a single platform. Alternatively, each lens may be on a separate independent platform.

Figure 11:
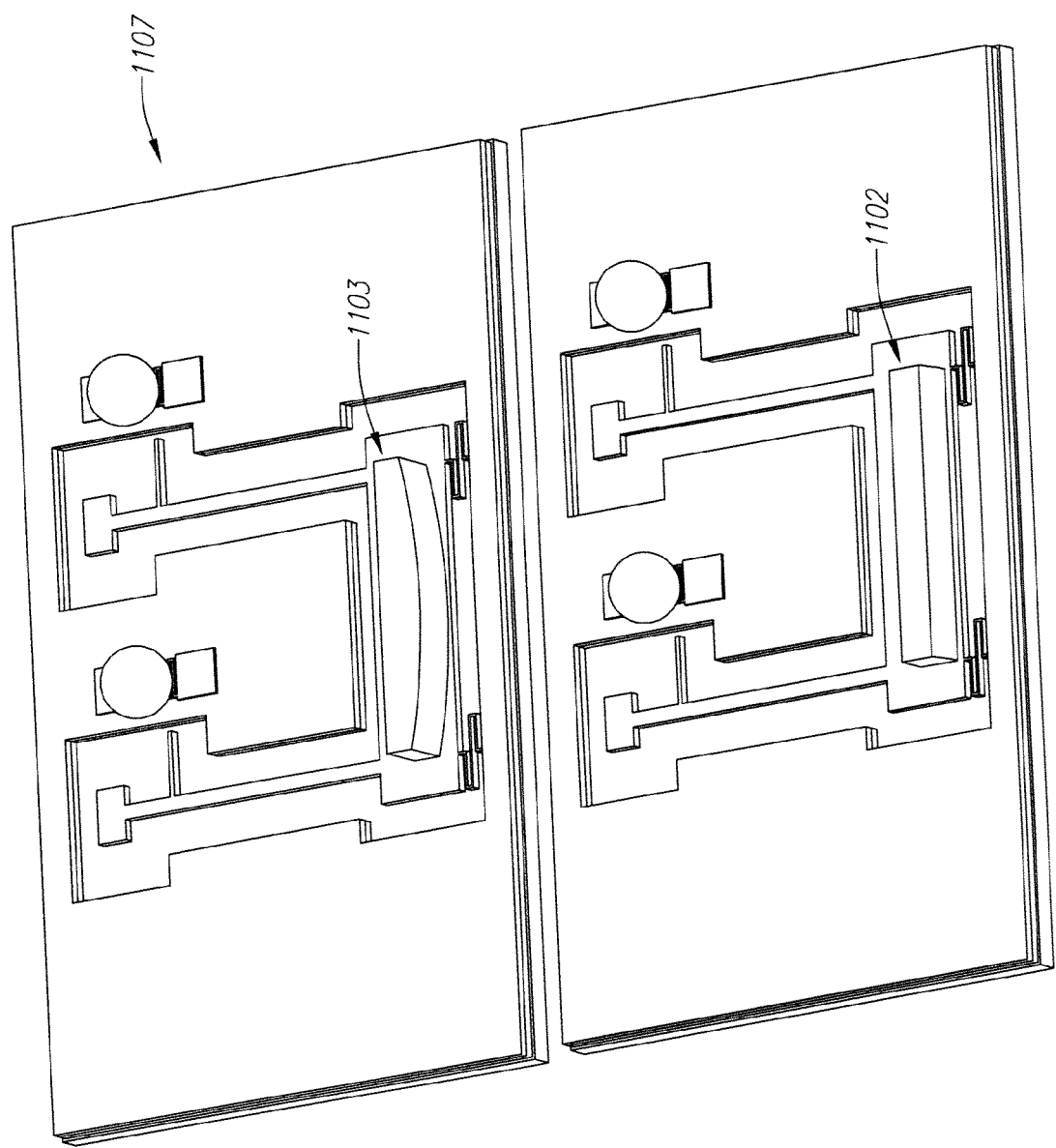
FIG. 11 illustrates multiple MEMs alignment chips in accordance with aspects of the invention.

FIG. 11 illustrates an embodiment in which each lens is provided its own MEMs alignment chip, although in some embodiments the silicon structures may be included on a single chip. In the embodiment of FIG. 11, each MEMs alignment chip includes a silicon portion, with a platform in what may be considered a cutout of the silicon. The cutout may be formed by etching for example. The platform is coupled to an edge of the cutout by springs in the silicon. Dual extensions extend from the platform, with each extension having an arm near a handle terminating the extension. Movement of the extensions, for example using the handles, allows for positioning of a lens on the platform, with one of the platforms carrying the fast axis collimating lens and the other of the platforms carrying the slow axis collimating lens. Each arm of the extension extends towards a corresponding solder ball, which can be melted to capture at least a portion of the arm, and to fix the extension, and hence the platform, in position when the solder thereafter solidifies.

One problem with the approach of FIG. 10 is that the tolerances on the alignment of fold mirrors used, for example as the mirror 1004 in FIG. 10, are tight. In practice, the fold mirrors would typically require precise angular adjustment. The problem is especially pronounced for mirrors spaced at a large distance from the final coupling lens and output fiber.

Figure 7:
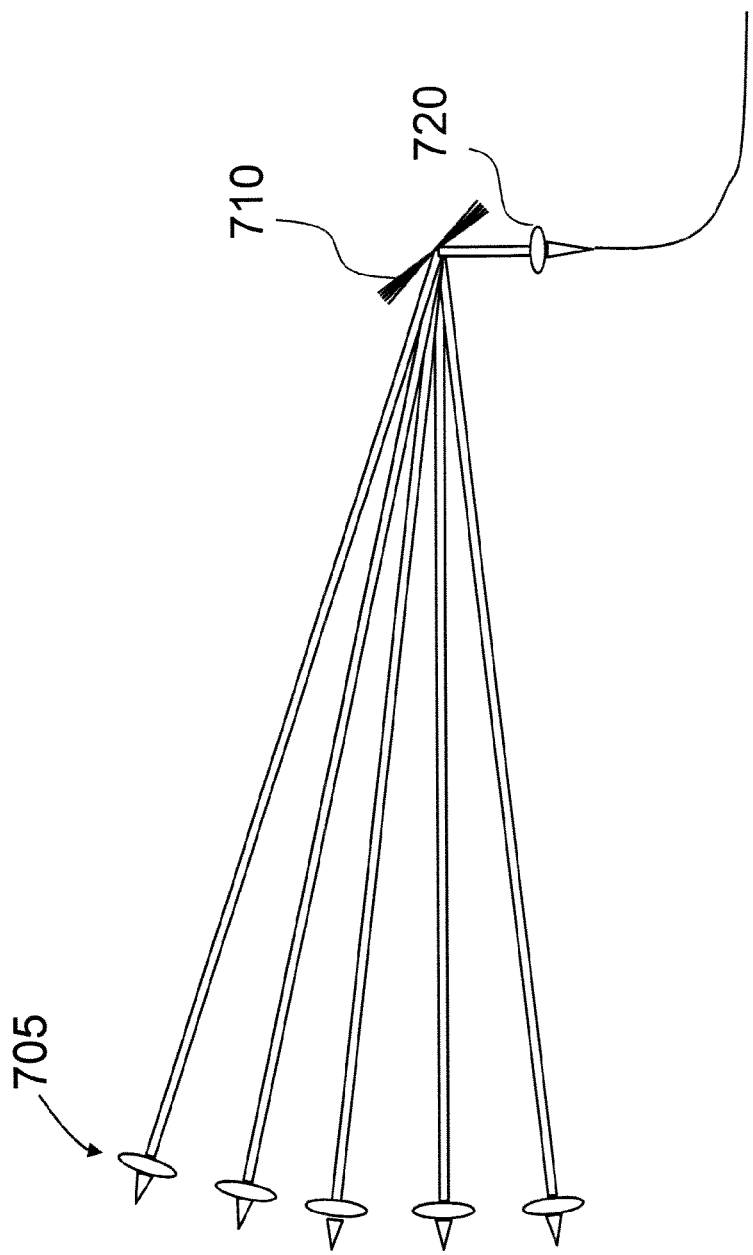
FIG. 7 illustrates a configuration where fold mirrors are positioned closer to an output fiber.
Figure 8:
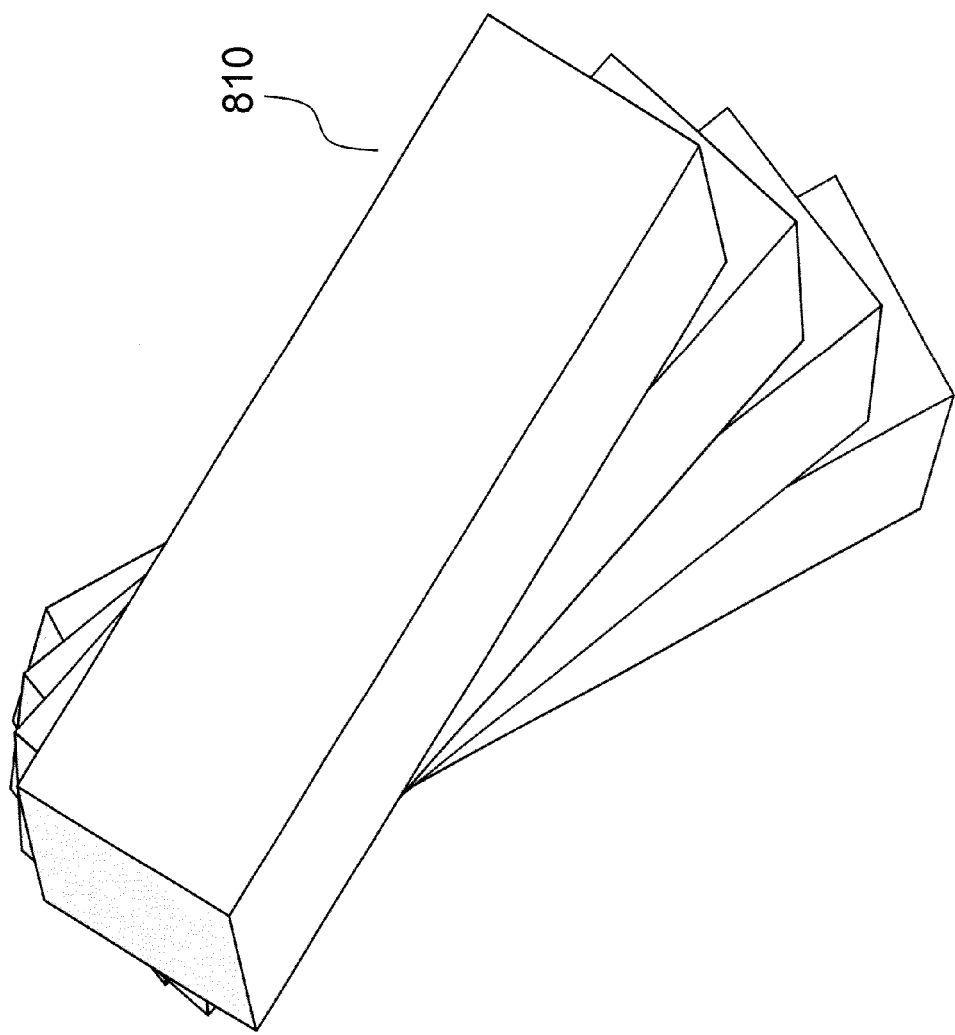
FIG. 8 illustrates a configuration of a stack of four mirrors.
Figure 9:
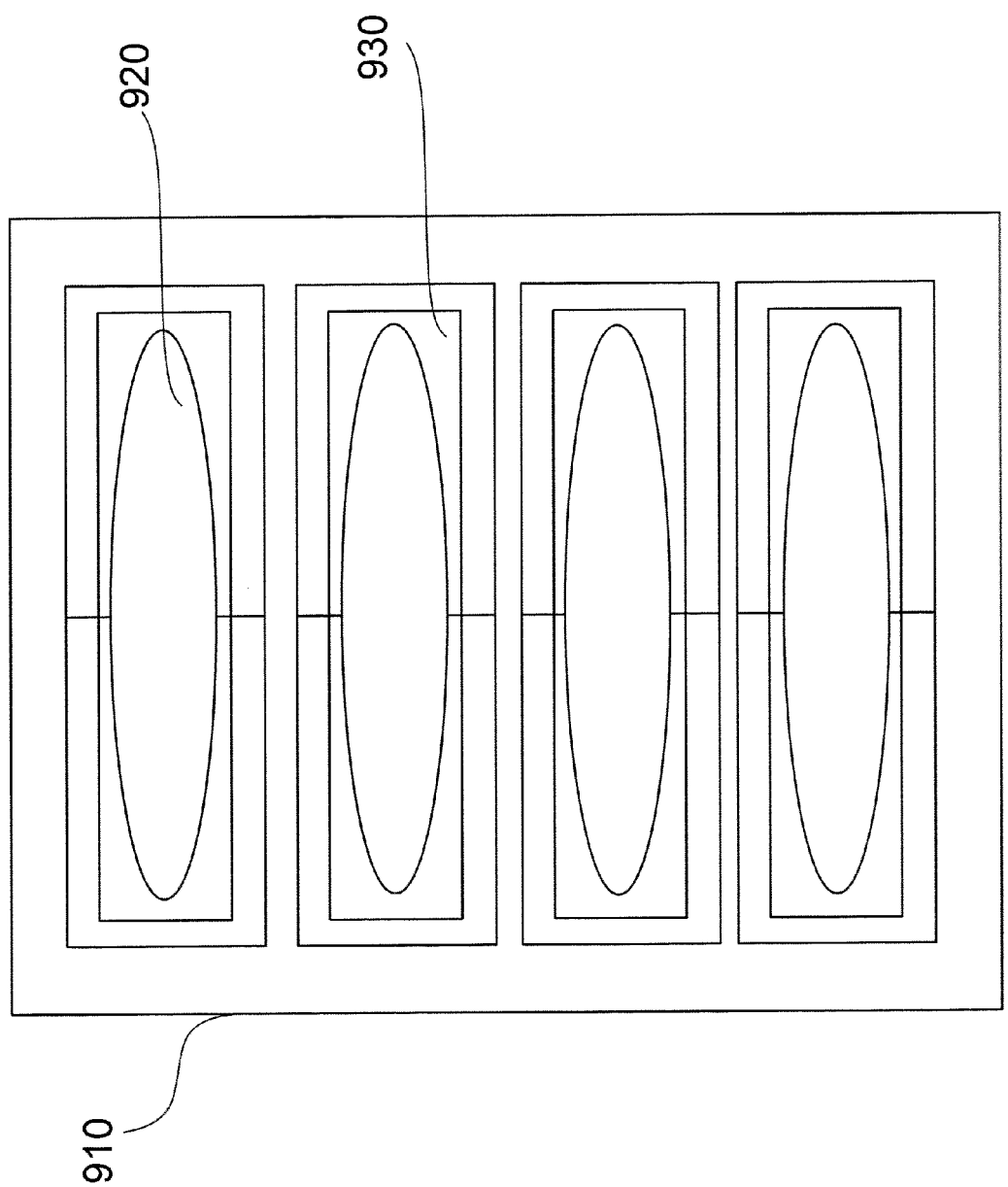
FIG. 9 illustrates the adjustability of the mirror angles by using a 1-D array of MEMs mirrors.

One way to reduce the tolerances is to position the fold mirrors closer to the output fiber. This case is shown in FIG. 7. Ideally, each submount, shown representatively by lenses 705, and collimated beam would be slightly angled, to impinge on a spiral stack of fixed mirrors 710. A focusing lens 720 would focus the beams on the fiber, as shown in FIG. 2b. One possible configuration of a stack of four mirrors 810 is shown in FIG. 8. In an alternate embodiment shown in FIG. 9, adjustability of the mirror angles can be retained by using a 1-D array of MEMs mirrors 910. This case is shown in FIG. 9. The beams are directed to the MEMs mirrors 920, mounted in a MEMs structure 930 allowing for individual positioning of the mirrors, by way of electrostatic force for example. Each mirror can be adjusted independently to direct the light to the focusing lens.

Although aspects of the invention have been described with respect to varying embodiments, it should be recognized that the invention comprises the novel and non-obvious claims and their insubstantial variations supported by this disclosure.

What is claimed is:

1. A broad area laser device, comprising:
   a plurality of broad area lasers;
   a planar lightwave circuit (PLC) to receive light from the lasers, the PLC including a plurality of broad area input waveguides, with one input waveguide for each of the plurality of broad area lasers, with each of the broad area input waveguides having a core with a horizontal width greater than a vertical height, with each of the broad area input waveguides being single mode in a vertical direction and multimode in a horizontal direction, with the broad area input waveguides coming together to form a single output waveguide having a width equal to a combined width of the broad area input waveguides; and
   a flattened tapered fiber to receive light from the PLC.

2. The broad area laser device of claim 1, wherein the PLC and the flattened tapered fiber are coupled together without intermediate optics.

3. The broad area laser device of claim 1, further comprising at least one lens to couple light from the plurality of broad area lasers into the PLC.

4. The broad area laser device of claim 3, wherein the at least one lens is mounted on a platform coupled to a body by springs.

5. The broad area laser device of claim 4, further comprising levers extending from the platform.

6. The broad area laser device of claim 5, wherein the levers extend from a side of the platform opposite the springs.

7. The broad area laser device of claim 5, further comprising solder fixing position of the levers with respect to the body.

8. The broad area laser device of claim 1, wherein the flattened tapered fiber includes an end and an extending cylindrical portion, where the end was an increased width and a decreased thickness compared to the cylindrical portion.

* * * * *

UNITED STATES PATENT AND TRADEMARK OFFICE
CERTIFICATE OF CORRECTION

PATENT NO. : 8,971,376 B2  
APPLICATION NO. : 13/205405  
DATED : March 3, 2015  
INVENTOR(S) : Bardia Pezeshki et al.

Page 1 of 1

It is certified that error appears in the above-identified patent and that said Letters Patent is hereby corrected as shown below:

In the Claims

In column 1, line 39, delete "low" and insert --10W--, therefor.

In column 2, line 2, delete "output:" and insert --output;--, therefor.

Signed and Sealed this  
Twenty-first Day of July, 2015

Michelle K. Lee  
*Director of the United States Patent and Trademark Office*